United States Patent
Miyashita

(10) Patent No.: US 7,816,691 B2
(45) Date of Patent: Oct. 19, 2010

(54) LIGHT-EMITTING DIODE HAVING A FLEXIBLE SUBSTRATE

(75) Inventor: Junji Miyashita, Fujiyoshida (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 71 days.

(21) Appl. No.: 12/033,480

(22) Filed: Feb. 19, 2008

(65) Prior Publication Data
US 2008/0203423 A1 Aug. 28, 2008

(30) Foreign Application Priority Data
Feb. 19, 2007 (JP) ............... 2007-038182

(51) Int. Cl.
*H01L 33/00* (2010.01)
(52) U.S. Cl. ............... 257/81; 257/79; 257/98; 257/99; 257/100; 257/E33.062; 257/E33.066
(58) Field of Classification Search ............ 257/79, 257/81, 82, 84, 99, 678, 692, 734, 735, 773, 257/E23.011, E23.031, E23.042, E23.047, 257/E23.048, E23.051, E23.052, E33.001, 257/E33.056, E33.057, E33.062, E33.066, 257/100, 787, E33.065, 98
See application file for complete search history.

(56) References Cited

U.S. PATENT DOCUMENTS

2005/0253158 A1* 11/2005 Yasukawa et al. ............. 257/98
2006/0157722 A1* 7/2006 Takezawa et al. ............. 257/98

FOREIGN PATENT DOCUMENTS

| JP | 2001-326390 A | 11/2001 |
|---|---|---|
| JP | 2007-059837 A | 3/2007 |

* cited by examiner

*Primary Examiner*—David Vu
*Assistant Examiner*—Suberr Chi
(74) *Attorney, Agent, or Firm*—Browdy and Neimark, PLLC

(57) ABSTRACT

A light-emitting diode is provided which includes: a sheet-like substrate; a pair of electrode patterns formed to wrap round and cover substantially entire upper and lower surfaces of the substrate, said pair of electrode patterns comprising an upper electrode portion, a lower electrode portion and a side electrode portion; a light-emitting element mounted on at least one of the electrode patterns; and a translucent sealing resin body that seals the light-emitting element. The pair of electrode patterns are separated by spaces formed therebetween, and substantially the entire surfaces of the substrate, except the spaces, are covered with the electrode patterns.

4 Claims, 3 Drawing Sheets

LIGHT-EMITTING DIODE HAVING A FLEXIBLE SUBSTRATE

CROSS-REFERENCE TO THE RELATED APPLICATION

This application is based on and claims priority from Japanese Patent Application No. 2007-38182, filed on Feb. 19, 2007, the disclosure of which is incorporated herein by reference in its entirety.

BACKGROUND OF THE INVENTION

1. Field of the Invention

The present invention relates to light-emitting diodes such as LEDs for general lighting, flashing LEDs for cellular phones, and LEDs for key illumination.

2. Description of Related Art

With the reduction in size of electronic devices, light-emitting diodes (hereinbelow referred to as LEDs) used in such electronic devices and the like are required to be further reduced in size and thickness. Surface mount-type LEDs are often used to satisfy the requirements for such LEDs and are generally composed of: an insulating substrate having electrode patterns formed on the surface thereof; a light-emitting element mounted on the substrate; and a light-transmitting sealing resin body that seals the light-emitting element. In the case that such an LED is mounted on the rear side of a motherboard, the LED is placed on the rear side of the motherboard. Then, edges of the upper surface of the substrate are secured to the rear side of the motherboard with the sealing resin body inserted in a hole penetrating the motherboard, and thus, the LED is mounted on the motherboard (see, for example, FIG. 4 and the description on page 4 of Japanese Patent Application Laid-Open No. 2001-326390).

A detailed description of the above LED will be given with reference to FIG. 5. The LED 20 includes: an insulating substrate 21 having a substantially rectangular parallelepiped shape; a pair of electrode patterns 22 and 23 formed on the upper surface of the substrate 21; a light-emitting element 24 mounted on one of the electrode patterns (electrode pattern 23) and electrically connected to the other electrode pattern 22 through a metal wire 25; and a light-transmitting sealing resin body 26 that covers and seals the light-emitting element 24 and the metal wire 25. Moreover, an external electrode 27 is formed in each of the four corners of the substrate 21.

Meanwhile, a motherboard 28 on which the LED 20 is to be mounted has a hole 29 which is provided in and penetrates the motherboard 28, the sealing resin body 26 of the LED 20 is disposed to be inserted in the hole, and the motherboard 28 also has electrode pads 30 on the rear side thereof, the electrode pads 30 being formed around the hole 29. The LED 20 is placed on the rear side of the motherboard 28, and the external electrodes 27 are bonded to the electrode pads 30 with solder 31, and thereby the LED 20 is mounted on the motherboard 28.

However, with the conventional technology described above, when the thickness of the substrate 21 of the LED 20 is reduced, the substrate 21 is likely to be fractured or deformed due to the load applied when the LED 20 is mounted on the motherboard 28. Moreover, separation of the sealing resin body 26 from the substrate 21 is likely to occur, for example, due to the bending deformation of the substrate 21.

SUMMARY OF THE INVENTION

It is an object of the present invention to provide an LED in which a substrate to mount a light-emitting element thereon is reduced in thickness as much as possible, and an LED configured to reduce the overall thickness and also prevent an occurrence of fracture, deformation, or other defects when the LED is mounted on the rear side of a motherboard including a hole in which a sealing resin of the LED is inserted.

In order to achieve the above object, the LED of the present invention includes: a sheet-like substrate; a pair of electrode patterns disposed on the substrate and covering substantially entire upper and lower surfaces of the substrate, each of the pair of electrode patterns comprising an upper electrode portion, a lower electrode portion, and a side electrode portion connected to the upper and lower electrode portions, a light-emitting element mounted on at least one of the electrode patterns, and a light-transmitting sealing resin body which seals the light-emitting element.

The sheet-like substrate is composed of, for example, a flexible substrate.

Moreover, the pair of electrode patterns are disposed on the substrate, and each of the pair of electrode patterns comprising upper electrode portion, lower electrode portion, and side electrode portion connecting the upper and lower electrode portions, covering substantially entire upper and lower surfaces of the substrate.

Furthermore, the pair of electrode patterns has a space therebetween each at the upper and lower surfaces on the substrate, and these spaces may be provided at vertically aligned positions or may be provided at vertically displaced positions. When the spaces are provided at vertically displaced positions, the space provided on the lower surface of the substrate is placed outside the sealing resin body as viewed in plan. Hence, when the LED is mounted on a motherboard of an electronic device with the sealing resin body inserted into a hole penetrating the motherboard, the space provided on the lower surface of the substrate is placed in a position that overlaps the motherboard as viewed in plan.

In addition, when the spaces between the electrode patterns are provided at vertically displaced positions, the electrode pattern on which the light-emitting element is mounted may be configured that the lower electrode portion formed on the lower surface of the substrate has a larger area than the other electrode pattern has. In this manner, heat generated by the light-emitting element can be effectively released through the lower electrode portion.

DETAILED DESCRIPTION OF THE PREFERRED EMBODIMENTS

Preferred embodiments of the present invention will be explained in detail below with reference to the accompanying drawings.

Figure 1:
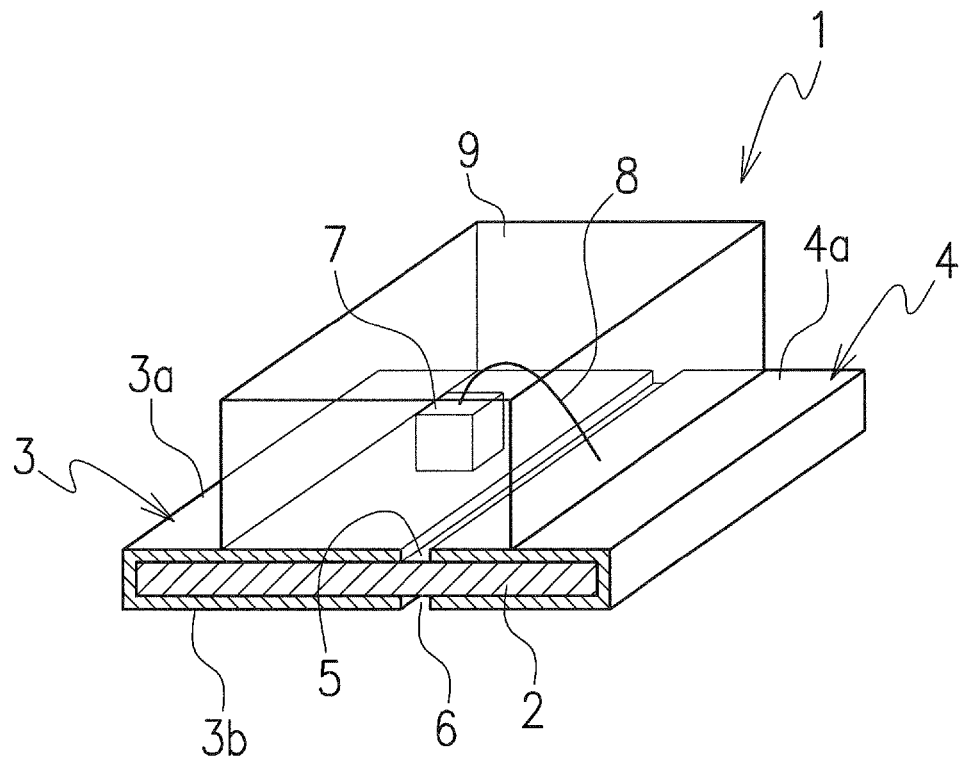
FIG. 1 is a perspective view illustrating an LED according to a first embodiment of the present invention.

FIG. 1 is a perspective view illustrating an LED according to a first embodiment of the present invention. The LED 1 according to the present embodiment includes an insulating substrate 2 and a pair of electrode patterns 3 and 4 formed on substantially entire surfaces of the substrate 2.

In order to reduce the substrate in thickness as much as possible, a sheet-like flexible and thin substrate made of a material such as polyimide is preferred as the material for the substrate 2.

Each of the pair of electrode patterns 3 and 4 is configured to extend from the upper surface of the substrate 2 to the lower surface of the substrate 2 with a left or a right side surface of the substrate 2 wrapped therewith. The electrode patterns 3 and 4 are disposed on the substrate and have spaces therebetween on the upper and lower surfaces of the substrate, respectively, and the spaces 5 and 6 are vertically aligned in top plan view. Therefore, the left and right electrode patterns 3 and 4 having substantially similar U-shaped cross section are placed left and right on the substrate and configured to be opposed to each other with the spaces 5 and 6 therebetween. The electrode patterns 3 and 4 cover substantially entire upper and lower surfaces of the base substrate 2, except the spaces 5 and 6, each of which extends parallel to the side surfaces of the substrate, the side surfaces on which electrode patterns are provided. The spaces 5 and 6 are not limited to slits of extremely narrow width and can have a greater width. The width of the spaces 5 and 6 can be freely designed so long as the reinforcement of the substrate 2 is not hampered and the object of the present invention can be achieved. In addition, the pair of electrode patterns 3 and 4 are composed of metal patterns having wiring formed by, for example, plating.

Moreover, in the LED 1 according to the present embodiment, a light-emitting element 7 is mounted on an upper electrode portion 3a of one of the electrode patterns (the electrode pattern 3), and this light emitting element 7 is electrically connected to an upper electrode portion 4a of the other electrode pattern 4 through a metal wire 8. Furthermore, the light emitting element 7 and the metal wire 8 are covered with a light-transmitting sealing resin body 9.

Figure 2:
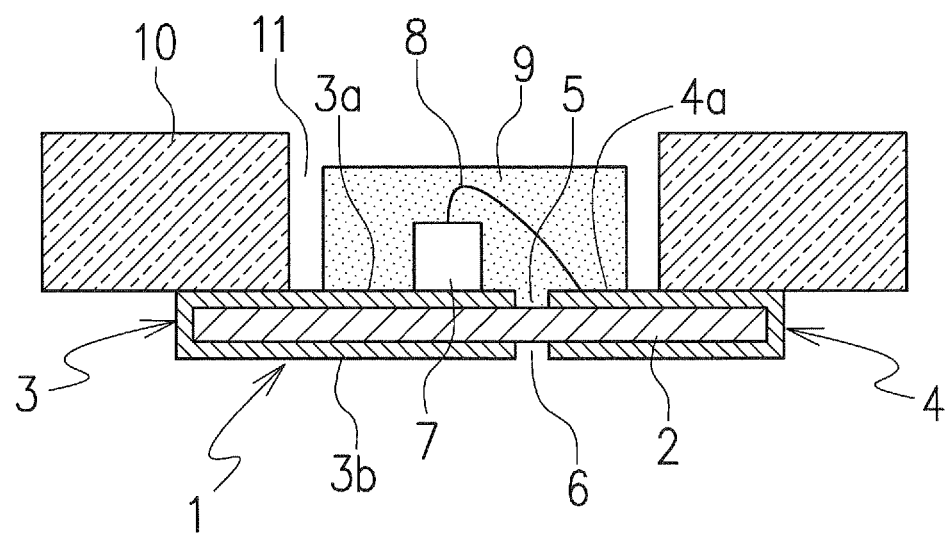
FIG. 2 is a cross-sectional view showing the state where the LED is attached to a motherboard.

The thus-configured LED 1 is placed on the rear side of a motherboard 10 as shown in, for example, FIG. 2, and is mounted on the rear side of the motherboard 10 with the sealing resin body 9 inserted in a hole penetrating the motherboard 10. Wiring patterns (not shown) are formed on the rear side of the motherboard 10, and the upper electrode portions 3a and 4a of the LED 1 are bonded to the wiring patterns around the hole 11, whereby the LED 1 is mounted on the motherboard 10.

As described above, the entire substrate 2 of the LED 1 is formed to have a reduced thickness but is reinforced by forming the electrode patterns 3 and 4 on substantially the entire upper and lower surfaces of the substrate 2. Therefore, the substrate 2 is prevented from being fractured and deformed due to the load applied when the LED 1 is mounted on the motherboard 10. In addition, since the substrate 2 resists bending deformation, separation of the sealing resin body 9 from the substrate 2 is less likely to occur.

Figure 3:
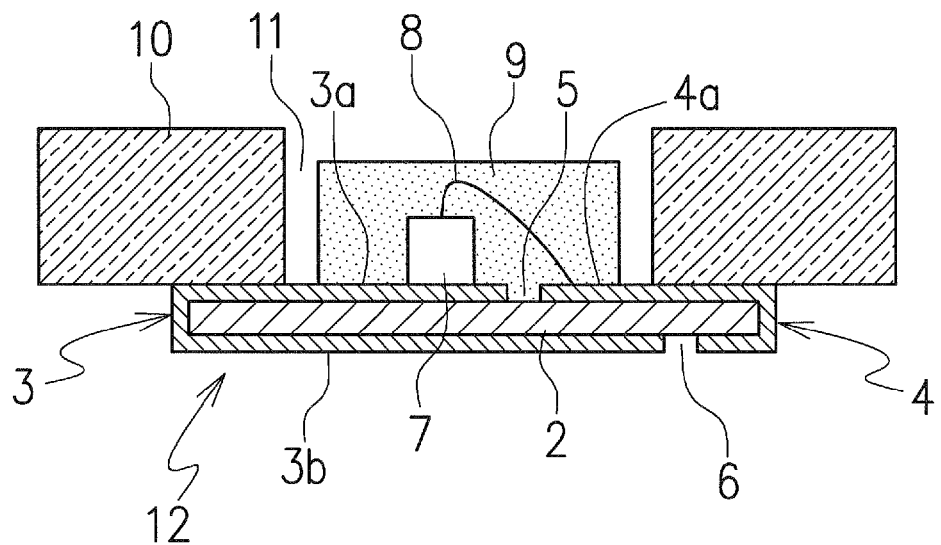
FIG. 3 is a cross-sectional view showing the state where an LED according to a second embodiment of the present invention is attached to a motherboard.

FIG. 3 shows a cross-sectional structure showing the state where the upper surface of a substrate of an LED according to a second embodiment of the present invention is mounted on the rear side of a motherboard. The LED 12 according to the present embodiment is different from the LED 1 according to the first embodiment described above only in the positions of the spaces 5 and 6 that separate the pair of electrode patterns 3 and 4 formed on the upper and lower surfaces of the substrate 2. Therefore, the same parts and components as those of the LED 1 of the first embodiment are designated by the same reference numerals, and detailed descriptions thereof are omitted.

In the LED 12 according to the present embodiment, the spaces 5 and 6 formed between the pair of electrode patterns 3 and 4 are provided at vertically displaced positions on the upper and lower surfaces of the substrate 2. In particular, the space 6 on the lower surface of the substrate 2 is provided at a position greatly displaced to the right in FIG. 3, and thus, a lower electrode portion 3b of the electrode pattern 3 on which the light-emitting element 7 is mounted is formed to have a large area.

Accordingly, the LED 12 according to the present embodiment has, of course, the same operational effect as the LED 1 according to the above first embodiment. Furthermore, an additional operational effect can, for example, be obtained in which the heat generated by the light emitting element 7 can be effectively released through the lower electrode portion 3b of the electrode pattern 3 on the side on which the light-emitting element 7 is mounted.

Moreover, in the present embodiment, the space 6 between the electrode patterns on the lower surface of the base substrate 2 is placed outside the sealing resin body 9 as viewed in plan, i.e. is provided at a position that does not overlap the sealing resin body 9 as viewed in top plan. Therefore, as shown in FIG. 3, when the LED 12 is mounted on the motherboard 10 with the sealing resin body 9 inserted from the rear side into the through hole 11 penetrating the motherboard 10, the space 6 on the lower surface of the substrate 2 overlaps the motherboard 10 as viewed in top plan. Therefore, the substrate 2 is reinforced further, and the electrode patterns 3 and 4 play a role in preventing deformation. Especially, when a soft or flexible resin such as silicone is used for the sealing resin of the LED, the space between the electrodes on the lower surface of the substrate is better to be positioned outside the sealing resin body as viewed in top plan, for reinforcement of the substrate and the LED overall.

Figure 4:
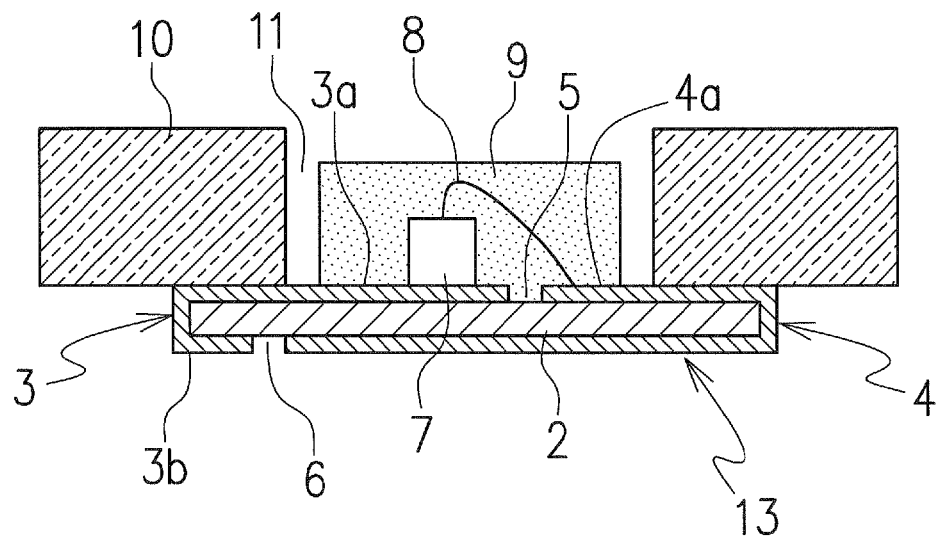
FIG. 4 is a cross-sectional view showing the state where an LED according to a third embodiment of the present invention is attached to a motherboard.
Figure 5:
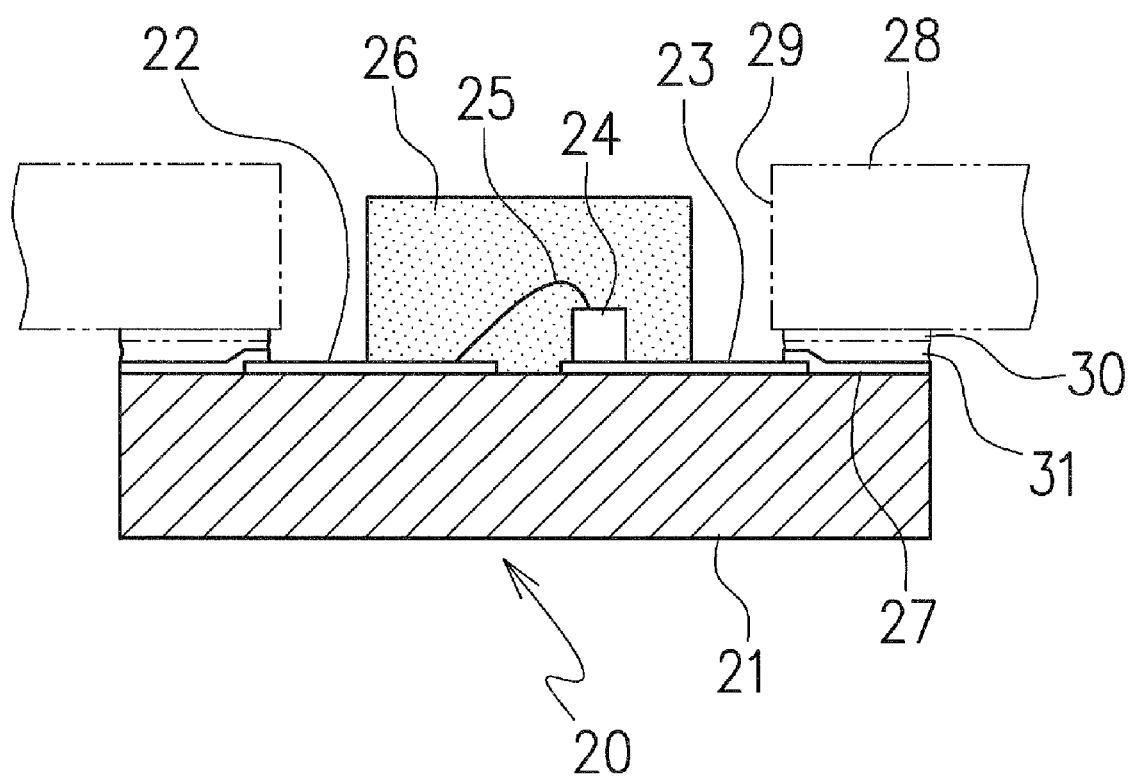
FIG. 5 is a cross-sectional view illustrating an example of a conventional LED.

In contrary to the second embodiment, when the space 6 on the lower surface of the substrate 2 is provided at a position greatly displaced to the left as in a third embodiment of the present invention shown in FIG. 4, the same operational effect as that of LED 1 according to the first embodiment can, of course, be obtained. In addition to this, the effect of reinforcing the base substrate in accordance with the second embodiment can similarly be obtained. Also, in the LED 13 according to the present embodiment, the same parts and components as those of the LED 1 according to the first embodiment are designated by the same reference numerals, and detailed descriptions thereof are omitted.

As described above, according to the present invention, even when the substrate is formed to have a reduced thickness, the substrate is reinforced by the electrode patterns formed on substantially the entire upper and lower surfaces of the substrate for a prevention of deformation. Therefore, even when this LED is mounted on a motherboard on the rear side of the motherboard with the sealing resin disposed in a hole of the motherboard, deformation and bending of the substrate due to the load during mounting are suppressed can be prevented.

Moreover, of the spaces between the electrode patterns formed on the upper and lower surfaces of the substrate, the space on the lower surface of the substrate may be provided at a position outside the sealing resin body as viewed in plan, i.e., at a position which does not overlap the sealing resin body as viewed in plan. As described above, by providing the space on the lower surface of the substrate outside the sealing resin body, the space on the lower surface of the substrate overlaps the motherboard as viewed in plan when the light emitting diode is mounted on the motherboard with the sealing resin body inserted into the hole penetrating the mother board. Accordingly, the electrode patterns play a role in reinforcing the substrate, i.e., in preventing deformation of the substrate.

While the preferred embodiments of the present invention have been described above, the present invention is not limited to these embodiments. It should be noted that various modifications and variations may be made to these embodiments.

What is claimed is:

1. A light-emitting diode having a flexible substrate comprising:
    a flexible substrate in the form of a sheet;
    a first electrode pattern and a second electrode pattern disposed on the flexible substrate and covering substantially entire upper and lower surfaces of the flexible substrate, each of the first and second electrode patterns comprising an upper electrode portion, a lower electrode portion, and a side electrode portion connected to the upper and lower electrode portions;
    an upper space formed between the upper electrode portions and a lower space formed between the lower electrode portions of the first and second electrode patterns;
    a light-emitting element mounted on the upper electrode portion of the first electrode pattern; and
    a light-transmitting sealing resin body that is disposed on the flexible substrate and seals the light-emitting element and the upper space between the upper electrode portions,
    the lower electrode portion of the first electrode pattern having a larger area than the lower electrode portion of the second electrode pattern, and
    the lower space between the lower electrode portions being positioned outside the sealing resin body in top plan view.

2. The light-emitting diode having a flexible substrate according to claim 1,
    wherein the sealing resin body is provided at a central portion of the flexible substrate with upper electrode portions of the first and the second electrode patterns exposed from left and right of the sealing resin body.

3. The light-emitting diode having a flexible substrate according to claim 2, further comprising a motherboard that includes an upper surface and a lower surface, a penetrating hole penetrating from the upper surface to the lower surface, and has an electrode pattern provided at least on the lower surface,
    wherein the light-emitting diode is provided at a lower surface side of the motherboard with the sealing resin body of the light-emitting diode disposed in the penetrating hole of the motherboard, the upper electrode portions of the first and the second electrode patterns of the light-emitting diode are electrically connected to the electrode pattern provided on the lower surface of the motherboard, and the lower space between the lower electrode portions of the first and second electrode patterns of the light-emitting diode is disposed at a position overlapping the motherboard in top plan view.

4. The light-emitting diode having a flexible substrate according to claim 1,
    wherein the light-transmitting sealing resin body is composed of silicone.

* * * * *